United States Patent [19]

Sekine et al.

[11] Patent Number: 4,642,171
[45] Date of Patent: Feb. 10, 1987

[54] PHOTOTREATING APPARATUS

[75] Inventors: Makoto Sekine, Yokohama; Haruo Okano; Yasuhiro Horiike, both of Tokyo, all of Japan

[73] Assignee: Kabushiki Kaisha Toshiba, Kawasaki, Japan

[21] Appl. No.: 756,318

[22] Filed: Jul. 18, 1985

[30] Foreign Application Priority Data

Sep. 18, 1984 [JP] Japan .................. 59-195163

[51] Int. Cl.$^4$ .............................................. C23C 15/00
[52] U.S. Cl. ................................. 204/298; 204/298; 422/186; 422/186.3
[58] Field of Search ............ 156/345; 422/186, 186.3; 430/311; 204/192 E, 298

[56] References Cited

U.S. PATENT DOCUMENTS 4,419,201 12/1983 Levinstein et al. ............ 204/192 E
4,496,420 1/1985 Frolich et al. ..................... 156/643
4,529,475 7/1985 Okano et al. ...................... 156/643

FOREIGN PATENT DOCUMENTS 0012128 1/1985 Japan .................................. 422/186

Primary Examiner—John E. Kittle
Assistant Examiner—Patrick Ryan
Attorney, Agent, or Firm—Oblon, Fisher, Spivak, McClelland, & Maier

[57] ABSTRACT

A phototreating apparatus has a vacuum container for storing a solid material, a gas inlet for introducing a photoreactive gas into the container, and a light source for radiating into the container, light having a specific wavelength such that it causes a photoreaction of the photoreactive gas. The apparatus phototreats the solid material in the container by utilizing the photoreaction of the photoreactive gas. At least an inner surface of the vacuum container consists of a material which absorbs the light having the specific wavelength.

9 Claims, 7 Drawing Figures

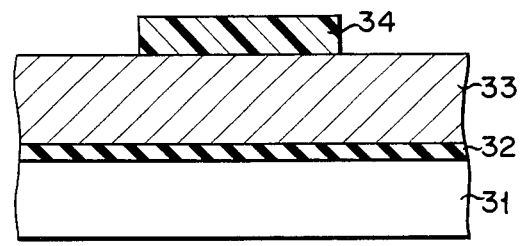
F I G. 4A
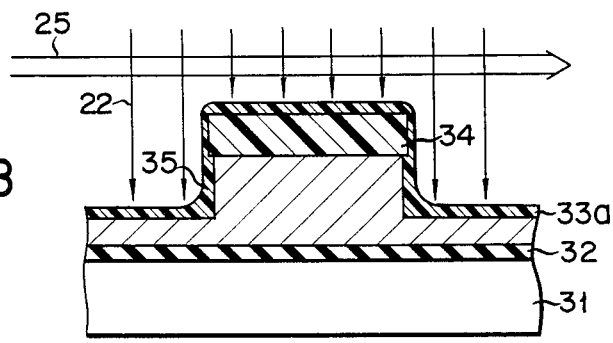
F I G. 4B
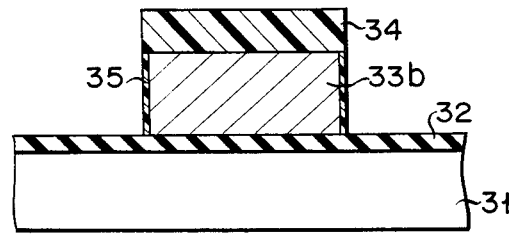
F I G. 4C
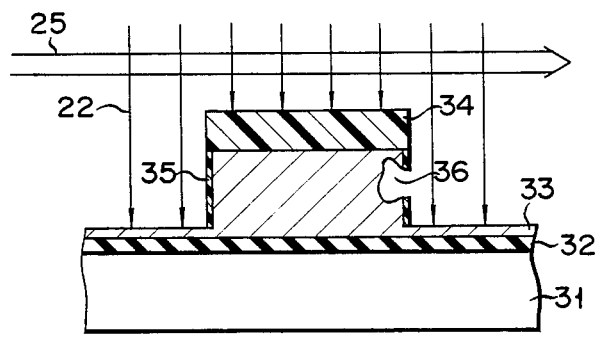
F I G. 5

PHOTOTREATING APPARATUS

BACKGROUND OF THE INVENTION

I. Field of the Invention

The present invention relates to an improvement in an apparatus for phototreating a solid material, wherein etching of or film formation on the solid material can be performed by utilizing a photochemical reaction.

II. Description of the Prior Art

Micropatterning of integrated circuits has been developing recently. For example, a VLSI having a minimum pattern dimension of 1 to 2 [μm] was experimentally developed. Such micropatterning requires plasma etching techniques. In accordance with one plasma etching technique, a reactive gas such as $CF_4$ is introduced into a container storing parallel-plate electrodes. A sample is disposed on one electrode (cathode) to which RF power of 13.56 [MHz] is applied, while the other electrode (anode) is grounded to cause glow discharge across the electrodes, and to generate a plasma. Cations in the plasma are accelerated by a voltage drop in the vicinity of the cathode and bombarded against the sample, thereby etching it. This technique is called reactive ion etching (RIE) and is a major technique in micropatterning.

However, in RIE, a sample to be etched is disposed in a plasma. As a result, the sample is subjected to various radiation damage such as metallic contamination from the inner surface of the chamber, in addition to destruction of an oxide film, upon bombardment, by charged particles such as ions or electrons, shifts in the threshold voltage of the device due to soft X-rays, and trap induction in the oxide film. This radiation damage can be a critical unwanted factor in making a VLSI device. Therefore, an etching technique which causes no radiation damage is sought.

Dry etching techniques, free from damage, have been reported. Such techniques include anisotropic etching of Si or poly-Si by atomic F beam having a kinetic energy of only a gas temperature in glow discharge (e.g., H. Akiya, proc, 3rd, Symp, on Dry processes, P.119 (1981)), and etching techniques using laser or ultraviolet rays (e.g., T. J. Chuang; J. Chem. Phys. 74. 1453 (1981); H. Okano, T. Yamazaki, M. Sekine and Y. Horiike, Proc. of 4th Symp, on Dry processes, P.6, (1982)). In these etching techniques, the possibility of anisotropic etching, free of damage, has been demonstrated.

According to studies of the present inventors e.g., H. Okano, M. Sekine and Y. Horiike, Proc. of 4th Symp, on Dry processes, P.6 (1982)), in poly-Si etching in a $Cl_2$ atmosphere by ultraviolet ray radiation emitted by an Hg-Xe lamp, anisotropic etching was found to be similar in effect to conventionally reported ion assisted etching (e.g., J. W. Coburn and H. F. Winters, J. Appl. Phys., 50, 3189 (1979)). In such anisotropic etching, etching progresses much faster on a light-irradiated surface than on a non-irradiated surface. This effect is particularly notable in the etching of undoped poly-Si, monocrystalline Si, and p-type poly-Si doped with boron. A similar effect was found in the etching of $n^+$-type poly-Si which was doped with a high concentration of phosphorus, or, similarly, of Mo, W, Ta or a silicide thereof.

However, the above-mentioned technique has the following problems: Reactive gas radicals are optically dissociated in a gaseous phase and migrate below a mask, or, some scattered light from a surface to be etched is reflected by an inner surface of the chamber and reaches below the mask. Consequently, an undercutting 5 is formed under an etching mask 4, as shown in FIG. 1. Particularly, when a photoresist is used as the etching mask 4, since the resist is transparent to light, light irradiates a portion under the resist such that the undercutting 5 is easily formed. This undercutting 5 is a major obstacle in preventing micropatterning of the element, and is, therefore, a critical problem in VLSIs. Referring to FIG. 1, reference numeral 3 denotes a sample, such as poly-Si, to be etched; 2, an $SiO_2$ film; and 1, an Si substrate.

FIG. 2 is a view for explaining a mechanism of anisotropic etching which has been clarified in recent studies on RIE. According to one mechanism, a recombination reaction (e.g., C. J. Mogab and H. J. Levinstein; J. Vac. Sci. Technol, 17, 721 (1980)) of Cl radicals as an etchant and $CF_4$ radicals generated from $C_2F_6$ as an additive gas, prevents lateral etching of an etching wall 6. According to another mechanism, a thin film 7 forming the etching mask and consisting of various kinds of unsaturated polymers such as the decomposed material of a resist, or a material formed by discharge, is deposited on the wall 6 so as to prevent penetration by the etchant (e.g., R. H. Bruce and G. P. Malafsky; E.C.S. meeting, Abs. No. 288, Denver, 1981 or Takashi Yamazaki, Haruo Okano and Yasuhiro Horiike, 30th Meeting of the Society of Applied Physics, preparatory articles, Spring Meeting, 1983).

SUMMARY OF THE INVENTION

It is, therefore, an object of the present invention to provide an apparatus and method wherein and whereby, upon treating a solid material by utilizing a photochemical reaction, reflection and scattering of light in the apparatus are eliminated so that the solid material can be phototreated to a high level of precision.

According to an aspect of the present invention, there is provided an apparatus for phototreating a solid material having a vacuum container for storing a solid material, means for supplying a photoreactive gas to the container, and a light source for radiating, to the container, light, having a specific wavelength, that causes a photoreaction of the photoreactive gas, this photoreaction thereby phototreating the solid material in the container. The inner surface of at least the vacuum container comprises a material which absorbs the light having the specific wavelength. Examples of such a material include carbon, poly-tetrafluoroethylene resin, and polyimide resin.

The light-absorbing material can be coated on the inner surface of the vacuum container, or the overall container can be comprised of the light-absorbing material.

Ultraviolet rays can be used as a light beam having a wavelength causing the photoreaction of the photoreactive gas. The light source can be arranged to emit light vertically onto the surface of the solid material to be treated.

The apparatus, according to the present invention, can be adapted to an etching apparatus or a deposition apparatus.

According to another aspect of the present invention, there is provided a method of phototreating a solid material, having the steps of:

arranging a solid material in a vacuum container, at least an inner surface of which comprises a light-absorbing material;

introducing a photoreactive gas into said container; and radiating light onto a surface of the solid material, thereby causing the photoreaction of the photoreactive gas, phototreating the solid material by utilizing the photoreaction.

Examples of such a photoreactive gas to be used in the present invention include an etching gas and a deposition gas. Examples of the etching gas include a halogen gas such as $Cl_2$ or a gas containing halogen atoms, such as $CCl_4$. Examples of such a deposition gas include organometallic compounds such as an organosilane compound (e.g., $Si(CH_3)_4$), organogermanium compound, organoaluminum compound, organophosphine compound, organoborane compound and organoarsine compound; halogen derivatives thereof; silane; arsine or phosphine.

When the method of the present invention is applied to etching of a solid material, the etching gas is used for etching a portion of the solid material to be etched. The deposition gas is used as a thin film deposition on the portion of the solid material which is not to be etched. By way of example, the etching gas is dissociated upon radiation of light onto the surface of the solid material to be etched, thereby forming an active species. Etching reaction of the active species and the solid material then progresses. Since the light does not radiate the portion not to be etched, i.e., a side surface of the solid material pattern formed by selective etching, etching reaction of such a portion does not occur. Due to dissociation of the deposition gas, a thin film is formed on this portion. In order to facilitate dissociation of the deposition gas, a second light, which passes inside the container parallel to the surface of the solid material to be etched, can be used.

The solid material can be freely selected if it easily reacts with the active species generated by dissociation of the photoreactive gas, or when the photoreaction with the photoreactive gas is promoted by irradiation of light. For example, a semiconductor material such as silicon or germanium, a metallic material such as aluminum, tungsten or molybdenum, or an insulating material such as silicon oxide or silicon nitride can be used as the solid material.

The present invention is applicable to various types of surface treatment of solid materials utilizing directionality of light.

BRIEF DESCRIPTION OF THE DRAWINGS

FIGS. 4A to 4C are sectional views for showing etching processes of the apparatus shown in FIG. 3; and FIG. 5 is a view for explaining an effect of the present invention.

DETAILED DESCRIPTION OF THE PREFERRED EMBODIMENT

Figure 1:
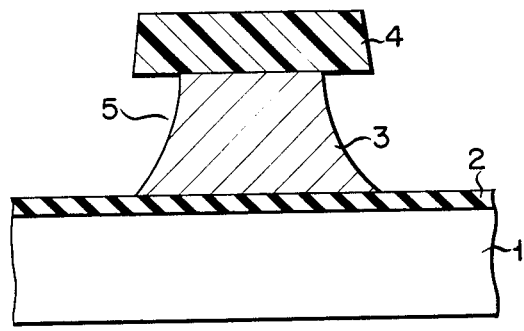
FIG. 1 is a view for explaining drawbacks of a conventional etching apparatus.
Figure 2:
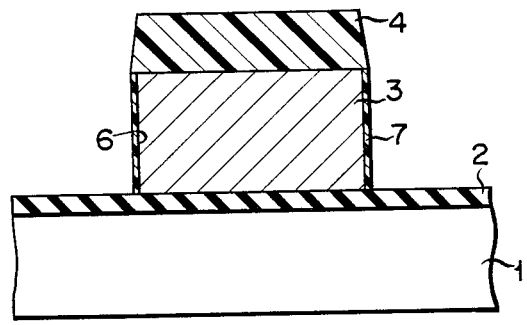
FIG. 2 is a view for explaining a mechanism of conventional anisotropic etching.
Figure 3:
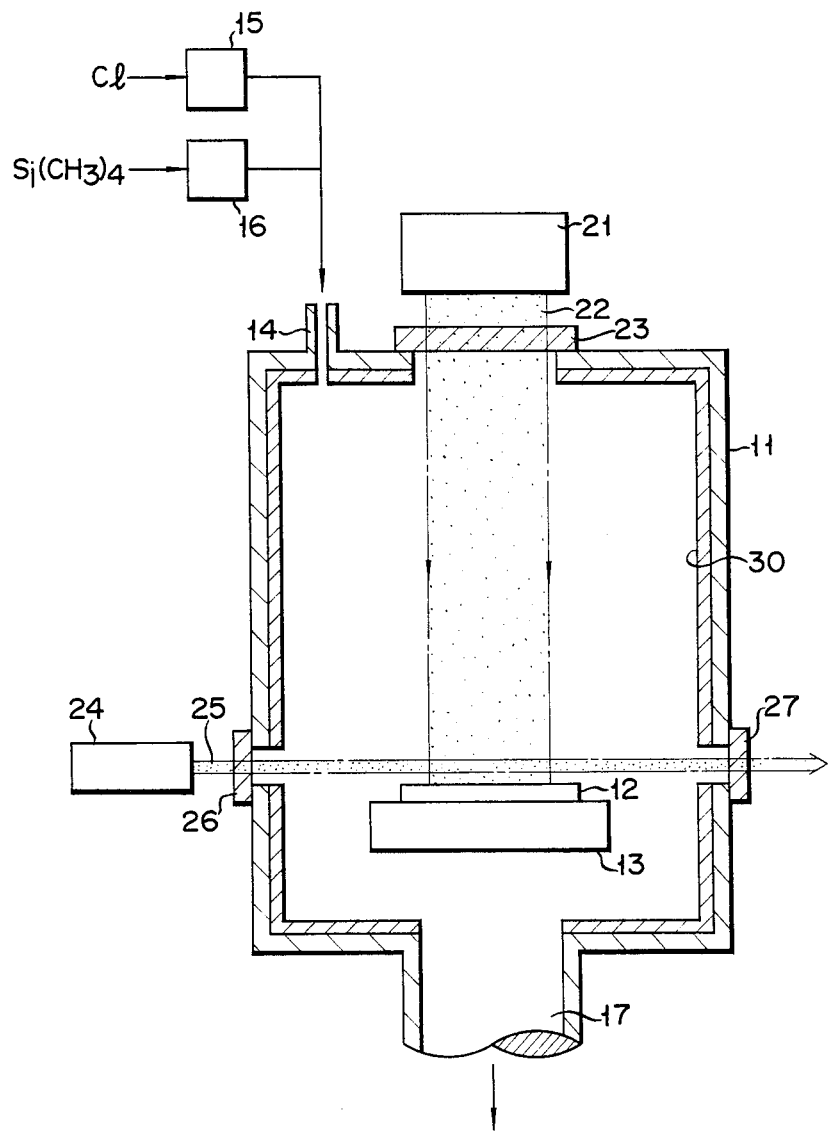
FIG. 3 is a sectional view of a dry etching apparatus according to an embodiment of the present invention.

FIG. 3 is a sectional view of a dry etching apparatus according to an embodiment of the present invention. Referring to FIG. 3, a susceptor 13 for supporting a substrate 12 is arranged in a vacuum container (reaction container) 11 constituting an etching chamber. A heater (not shown) is fitted on the susceptor 13 for heating the substrate 12. The susceptor 13 can move along orthogonal x- and y-axes on a horizontal plane. A photoreactive gas such as $Cl_2$ is supplied from a flow rate controller 15 to the container 11 through a gas inlet 14. A deposition gas such as $Si(CH_3)_4$ is supplied from a flow rate controller 16 to the container 11 through the gas inlet 14. The container 11 has a gas outlet 17 for evacuating the gas therethrough.

A first light source 21 for dissociating the photoreactive gas is arranged above the vacuum container 11. The light source 21 comprises a Cd-He laser for emitting light (laser beam) 22, having its emission center at a wavelength of 325 nm. The first light 22 from the light source 21 is introduced to the container 11 through an ultraviolet ray-permeable window 23 in an upper wall of the container 11. It then vertically irradiates the upper surface of the substrate 12 on the susceptor 13.

A second light source 24 for dissociating the deposition gas is arranged to the left of the container 11. The light source 24 emits far ultraviolet rays. Second light 25 from the second light source 24 is introduced to the container 11 through a light-permeable window 26 in a side wall of the container 11, and passes parallel to the upper surface of the substrate 12. The light 25 is guided outside the container 11 through a light-permeable window 27 formed in the side wall of the container 11 opposite to the light-permeable window 26.

A layer consisting of a material for absorbing the first light 22, e.g., a carbon layer 30, covers the inner surface of the container 11 of the etching apparatus having the above-mentioned structure. The reflected or scattered light of the first light 22 irradiating the substrate 12 is absorbed in the carbon layer 30 and does not reach the substrate 12 again.

The etching process, in a case using the above-mentioned etching apparatus, will be described.

In this example, an $n^+$-polysilicon substrate is used as a sample to be etched. First, as shown in FIG. 4A, an $SiO_2$ film 32 is deposited on a silicon substrate 31. An $n^+$-polysilicon layer 33, as the sample to be etched, is deposited on the film 32, and an etching mask 34 comprising a photoresist is formed on the layer 33.

A semiconductor body, shown in FIG. 4A, is disposed on the susceptor 13 of the etching apparatus of FIG. 3. Etching is performed in the following manner. $Cl_2$, as a photoreactive gas, and $Si(CH_3)_4$, as a deposition gas, are introduced into the container 11 through the gas inlet 14. Ultraviolet rays having a wavelength of 300 to 400 nm, are radiated as the first light 22 from the first light source 21 onto the semiconductor body. Far ultraviolet rays are radiated, as the second light from the second light source 24, to pass above the semiconductor body. Then, $Cl_2$, as the photoreactive gas, is dissociated by the first light 22 to form Cl radicals. The Cl radicals etch the $n^+$-polysilicon film 33. Meanwhile, the $Si(CH_3)_4$ gas, as the deposition gas, is dissociated by the second light source 25 and reacts with the Cl radicals to form a non-volatile deposited film on the surfaces of the $n^+$-polysilicon film 33 and the mask 34. The film deposited on the $n^+$-polysilicon film 33 protects the film 33 from penetration by the Cl radicals. As a result, a portion of the film 33 covered with the deposited film is not etched. In contrast to this, a light-irradiated surface of the polysilicon film which is not covered with the deposited film, is etched at a higher rate than the deposition rate, due to a photo-assist effect (mainly attributable to thermal reaction or photochemical reaction). As a result, vertical etching is performed so that anisotropic etching, which does not cause undercutting, can be achieved.

For the sake of explanation, FIG. 4B shows a state wherein the film 33 is etched to a certain degree, thereafter, radiation of the first light 22 is stopped such that only the etching reaction is stopped. In such a case, the deposition reaction continues, and a non-volatile deposited film 35 is uniformly formed on the surfaces of a polysilicon film 33a and the mask 34. When the first light 22 is radiated in this state, a portion of the deposited film 35 irradiated with the first light 22, is quickly etched, and, thereafter, vertical etching of the film 33a progresses. Meanwhile, on a side surface of the film 33a not irradiated with light, the deposition reaction progresses faster than the etching reaction. As a result, a thin deposited film 35 is formed to protect the side surface of the film 33a so that anisotropic etching is attained, thereby obtaining a polysilicon pattern 33b without undercutting, as shown in FIG. 4C. It must be noted that since the film 35 on the side surface of the film 33b is extremely thin, it does not degrade the patterning accuracy.

In order to obtain the pattern 33b having no undercutting, as described above, the first light 22 must radiate the surface to be etched, vertically. However, the first light 22 can be reflected or scattered by the surface to be etched, and then reflected by the inner surface of the container 11 to become incident again on the surface to be treated. If the light is reflected by the container 11, as shown in FIG. 5, the film 35 on the side surface of the film 33a is etched, thereby generating an undercutting 36. However, according to the present invention, the inner surface of the container 11 is coated with a light-absorbing material film 30 comprising carbon or the like. As a result, the first light 22 reflected or scattered from the surface to be etched does not become incident again on the surface to be etched.

As has been mentioned previously, according to the present invention, the layer 33, as a sample to be etched, can be selectively etched by light radiation without using charged particles such as electrons and ions. In addition, since concurrent etching and film formation are utilized, anisotropic etching is enabled. Furthermore, since the carbon layer 30 (light-absorbing material layer) is deposited on the inner surface of the container 11, nonuniform etching (e.g., occurrence of undercutting), caused by reflection or scattering of the light 22, can be prevented to contribute to proper micropatterning and integration of semiconductor devices.

The present invention is not limited to the above-described embodiment. Although the present invention has been described with respect to a case of etching, it can also be applied to film formation. For example, referring to the apparatus shown in FIG. 3, $Si(CH_3)_4 + O_2$ and $CCl_4$ can be used as a deposition gas and a reactive gas, respectively, so that a thin film can be formed on a substrate to be treated. In this case, light irradiation heats and electronically excites the substrate so that deposition on the light-irradiated portion is performed. Thus, a film can be deposited only on the light-irradiated portion. In this case, the light-absorbing material layer is provided inside the container 11 in order to prevent light from radiating a portion on which a film is not to be deposited. The present invention can also be applied to surface treatment of a semiconductor substrate or the like.

What is claimed is:

1. A phototreating apparatus having a vacuum container for storing a solid material, means for introducing a photoreactive gas into said container, and a light source for supplying light having a predetermined wavelength to said container, causing a photoreaction of the photoreactive gas, said apparatus phototreating the solid material in the container by utilizing the photoreaction of the photoreactive gas, wherein at least an inner surface of said vacuum container comprises a light-absorbing material capable of absorbing the light having the predetermined wavelength.

2. An apparatus according to claim 1, wherein a layer comprising said light-absorbing material is coated on an inner surface of said vacuum container.

3. An apparatus according to claim 1, wherein said vacuum container comprises said light-absorbing material.

4. An apparatus according to claim 1, wherein said light-absorbing material is a member selected from the group consisting of carbon, polytetrafluoroethylene resin and polyimide resin.

5. An apparatus according to claim 1, wherein said light source emits ultraviolet rays.

6. An apparatus according to claim 1, wherein said light source is arranged to vertically radiate a surface of the solid material to be treated.

7. An apparatus according to claim 6, further comprising another light source for emitting light which passes through said container parallel to said surface of the solid material to be treated.

8. An apparatus according to claim 1, wherein selective etching on a light-irradiated surface of the solid material is performed.

9. An apparatus according to claim 1, wherein a film is deposited on a light-irradiated surface of the solid material.

* * * * *